United States Patent
Kim

(10) Patent No.: US 12,135,504 B2
(45) Date of Patent: Nov. 5, 2024

(54) METHOD FOR DETERMINING BEST FOCUS AND BEST DOSE IN EXPOSURE PROCESS

(71) Applicant: SAMSUNG ELECTRONICS CO., LTD., Suwon-si (KR)

(72) Inventor: Kihyun Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 547 days.

(21) Appl. No.: 17/528,637

(22) Filed: Nov. 17, 2021

(65) Prior Publication Data
US 2022/0365447 A1    Nov. 17, 2022

(30) Foreign Application Priority Data
May 12, 2021   (KR) .................. 10-2021-0061322

(51) Int. Cl.
G03F 7/00   (2006.01)

(52) U.S. Cl.
CPC ...... G03F 7/70558 (2013.01); G03F 7/70508 (2013.01); G03F 7/70625 (2013.01)

(58) Field of Classification Search
CPC ... G03F 1/36; G03F 1/78; G03F 7/705; G03F 7/706; G03F 7/70558; G03F 7/70508; G03F 7/70625; G03F 7/70641
USPC .......................................................... 716/54
See application file for complete search history.

(56) References Cited

U.S. PATENT DOCUMENTS

| | | | |
|---|---|---|---|
| 7,030,966 B2 | 4/2006 | Hansen | |
| 8,057,967 B2 | 11/2011 | Ye et al. | |
| 8,065,636 B2 | 11/2011 | Ye et al. | |
| 8,703,405 B2 | 4/2014 | Sohn et al. | |
| 9,390,206 B2 | 7/2016 | Ye et al. | |
| 10,101,674 B2 | 10/2018 | Pandev | |
| 10,197,922 B2 | 2/2019 | Gutman et al. | |
| 10,679,333 B2 | 6/2020 | Sriraman | |
| 2006/0206851 A1 | 9/2006 | Van Wingerden et al. | |
| 2008/0180696 A1 | 7/2008 | Sugawara | |
| 2024/0036485 A1* | 2/2024 | Beukman | G03F 7/70625 |

* cited by examiner

*Primary Examiner* — Paul Dinh
(74) *Attorney, Agent, or Firm* — Muir Patent Law, PLLC

(57) ABSTRACT

A method for determining a best focus and a best dose in the disclosure includes selecting a selection pattern from first and second shot regions of a wafer for split, measuring a critical dimension (CD) value of the selection pattern, thereby deriving a measurement CD value, calculating an effective CD value of the selection pattern for each of the first and second shot regions using the measurement CD value, calculating an upper-limit CD value and a lower-limit CD value of the selection pattern using the effective CD value of the selection pattern, calculating a process window area for the first shot region and a process window area for the second shot region using the upper-limit CD value and the lower-limit CD value of the selection pattern, and comparing the process window area for the first shot region and the process window area for the second shot region with each other.

20 Claims, 9 Drawing Sheets

METHOD FOR DETERMINING BEST FOCUS AND BEST DOSE IN EXPOSURE PROCESS

CROSS-REFERENCE TO THE RELATED APPLICATION

This application claims priority from Korean Patent Application No. 10-2021-0061322, filed on May 12, 2021, in the Korean Intellectual Property Office, the disclosure of which is incorporated herein by reference in its entirety.

BACKGROUND

1. Field

Embodiments relate to a method for determining a best focus and a best dose in an exposure process.

2. Description of the Related Art

In accordance with recent demand for high integration of a semiconductor device, various lithography technologies for formation of a finer pattern are being developed. As the integration degree of a semiconductor device increases, the critical dimension (CD) of a photoresist pattern is further reduced.

SUMMARY

Embodiments are directed to a method for determining a best focus and a best dose, including: selecting a selection pattern from first and second shot regions of a wafer for split, measuring a critical dimension (CD) value of the selection pattern, thereby deriving a measurement CD value, calculating an effective CD value of the selection pattern for each of the first and second shot regions using the measurement CD value, calculating an upper-limit CD value and a lower-limit CD value of the selection pattern using the effective CD value of the selection pattern, calculating a process window area for the first shot region and a process window area for the second shot region using the upper-limit CD value and the lower-limit CD value of the selection pattern, and comparing the process window area for the first shot region and the process window area for the second shot region with each other.

Embodiments are directed to a method for determining a best focus and a best dose, including: selecting a first selection pattern and a second selection pattern of a first shot region of a wafer for split and selecting a first selection pattern and a second selection pattern of a second shot region of the wafer for split, calculating upper-limit CD values and lower-limit CD values of the first selection pattern of the first shot region, the second selection pattern of the first shot region, the first selection pattern of the second shot region and the second selection pattern of the second shot region, calculating a process window area for the first shot region and a process window area for the second shot region using the upper-limit CD values and the lower-limit CD values, and comparing the process window area for the first shot region and the process window area for the second shot region with each other.

Embodiments are directed to a method for determining a best focus and a best dose, including: includes exposing a first shot region of a wafer for split at a first focus value and a first dose value and exposing a second shot region of the wafer for split at a second focus value and a second dose value, selecting a first selection pattern and a second selection pattern of the first shot region, and selecting a first selection pattern and a second selection pattern of the second shot region, measuring CD values of the first selection pattern of the first shot region and the first selection pattern of the second shot region, thereby deriving first measurement CD values and measuring CD values of the second selection pattern of the first shot region and the second selection pattern of the second shot region, thereby deriving second measurement CD values, deriving a first effective CD function using the first measurement CD values and deriving a second effective CD function using the second measurement CD values, and calculating effective CD values of the first and second shot regions using the first effective CD function and the second effective CD function.

BRIEF DESCRIPTION OF THE DRAWINGS

Features will become apparent to those of skill in the art by describing in detail example embodiments with reference to the attached drawings in which.

DETAILED DESCRIPTION

Figure 1:
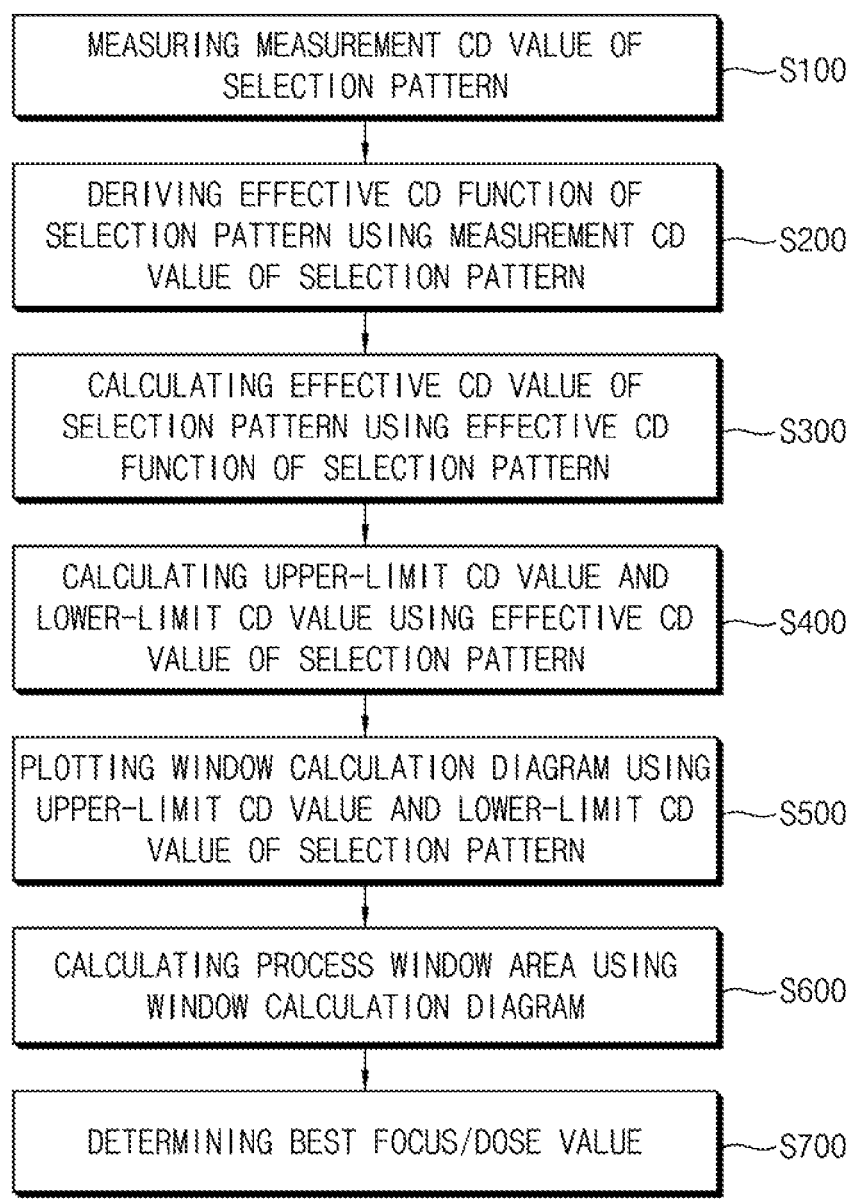
FIG. 1 is a flowchart of a method for determining a best focus and a best dose in an exposure process according to an example embodiment.

FIG. 1 is a flowchart of a method for determining a best focus and a best dose in an exposure process according to an example embodiment.

Referring to FIG. 1, the method for determining a best focus and a best dose in an exposure process may include measuring a measurement critical dimension (CD) value of a selection pattern (S100), deriving an effective CD function of the selection pattern using the measurement CD value of the selection pattern (S200), calculating an effective CD value of the selection pattern using the effective CD function of the selection pattern (S300), calculating an upper-limit CD value and a lower-limit CD value of the selection pattern using the effective CD value of the selection pattern (S400), plotting a window calculation diagram using the upper-limit CD value and the lower-limit CD value of the selection pattern (S500), calculating a process window area using the window calculation diagram (S600), and determining a best focus/dose value (S700).

In manufacture of a semiconductor device, a photoresist pattern may be formed at a photoresist film through execution of exposure and development processes, and a target film to be etched may be patterned using the photoresist pattern as an etch mask. A best focus value and a best dose value in an exposure process for formation of a photoresist pattern may be determined according to the method of FIG. 1.

Figure 2:
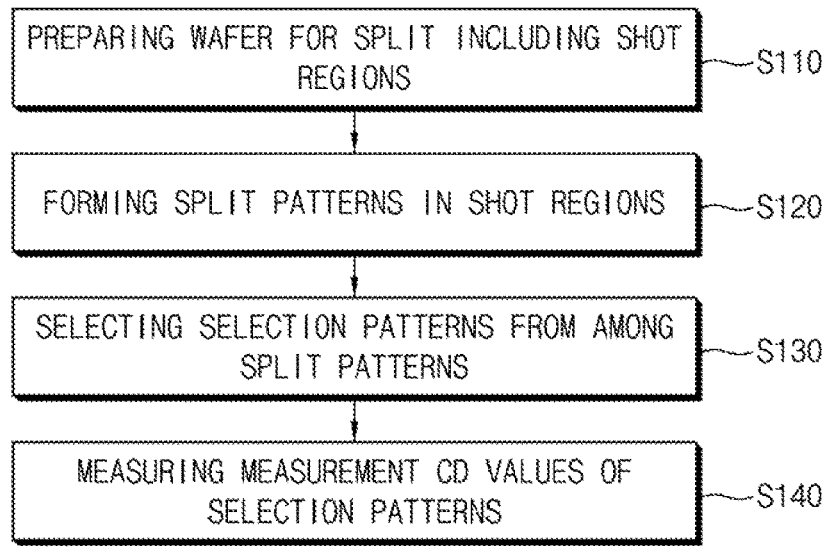
FIG. 2 is a detailed flowchart of a method for measuring a measurement CD value of a selection pattern.
Figure 3:
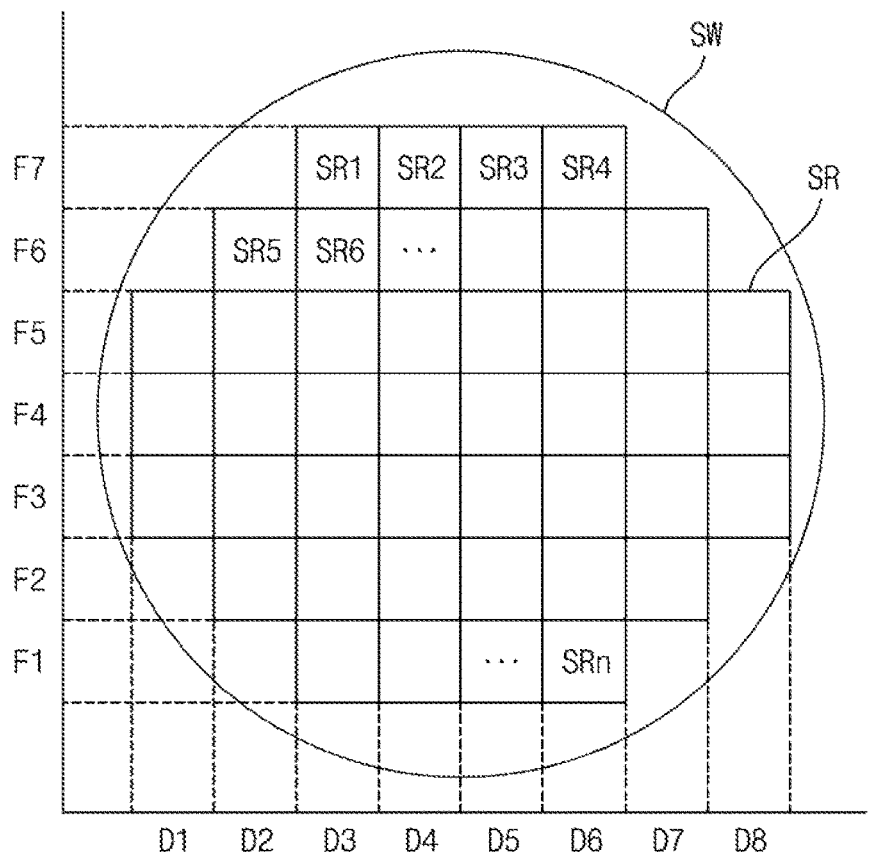
FIG. 3 is a view explaining a wafer for split.
Figure 4A:
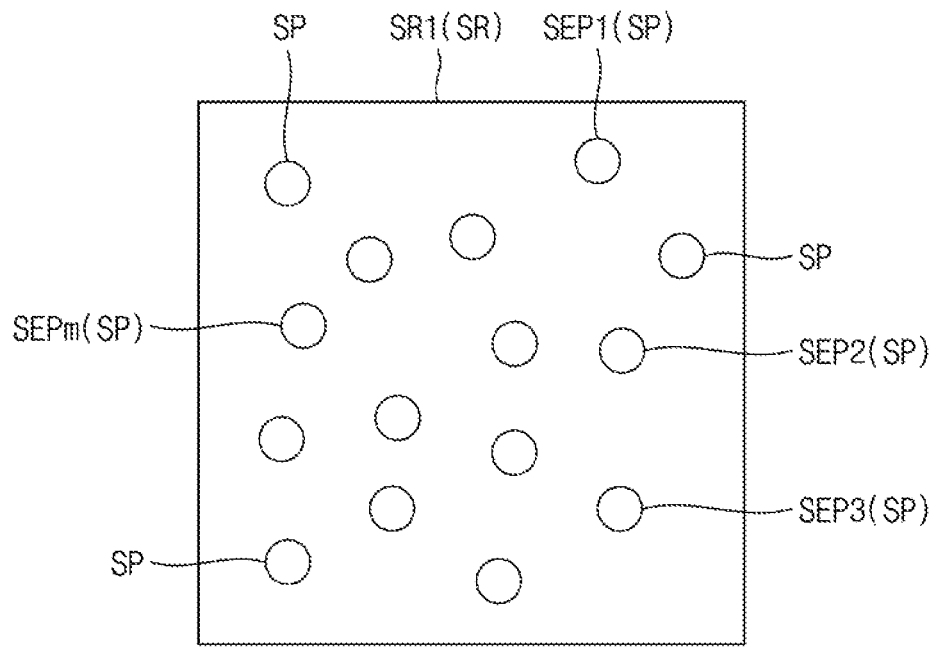
FIGS. 4A and 4B are views explaining a shot region.
Figure 4B:
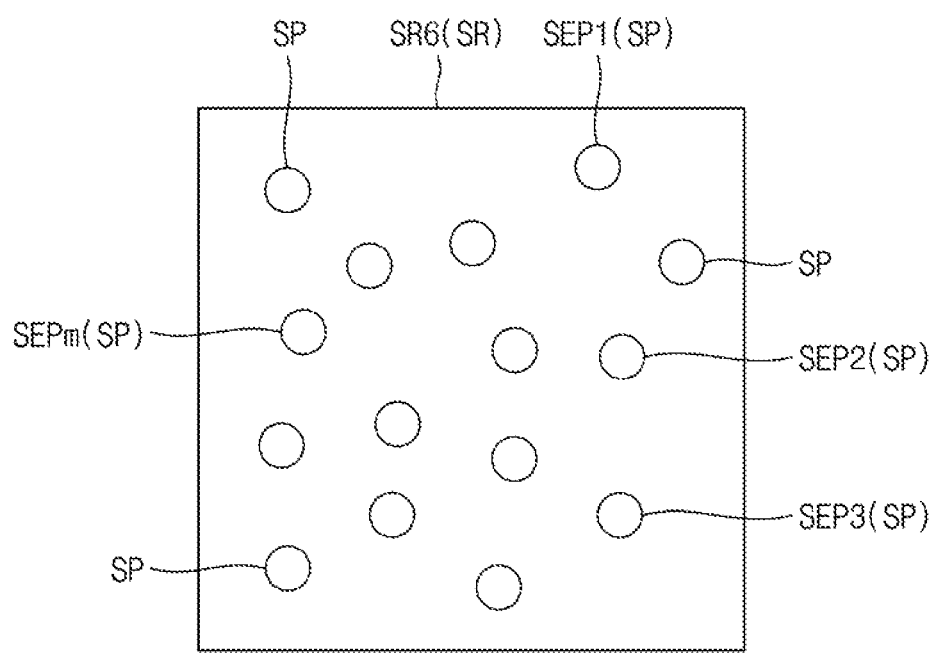

FIG. 2 is a detailed flowchart of a method for measuring a measurement CD value of a selection pattern. FIG. 3 is a view explaining a wafer for split. FIGS. 4A and 4B are views explaining a shot region.

Referring to FIG. 2, measurement of the measurement CD value of the selection pattern (S100) may include: preparing a wafer for split including shot regions (S110), forming split patterns in the shot regions (S120), selecting selection patterns from among the split patterns (S130), and measuring measurement CD values of the selection patterns (S140).

Referring to FIGS. 2 and 3, a wafer for split SW may be prepared (S110). The wafer for split SW may include a photoresist film. The photoresist film of the wafer for split SW may include a plurality of shot regions SR. The shot regions SR may include first to n-th shot regions SR1, SR2, SR3, SR4, SR5, SR6, . . . , and SRn. In an example embodiment, the wafer for split SW may be a focus-exposure matrix (FEM) wafer.

Each of the shot regions SR of the wafer for split SW may be a region that is exposed at one of a plurality of focus values and one of a plurality of dose values. In an example embodiment, the focus values may include first to seventh focus values F1, F2, F3, F4, F5, F6 and F7, and the dose values may include first to eighth dose values D1, D2, D3, D4, D5, D6, D7 and D8. The first to seventh focus values F1, F2, F3, F4, F5, F6 and F7 may be sequentially-incremented values. For example, the first to seventh focus values F1, F2, F3, F4, F5, F6 and F7 may sequentially be −0.145 μm, −0.13 μm, −0.115 μm, −0.1 μm, −0.085 μm, −0.07 μm, and −0.005 μm. The first to eighth dose values D1, D2, D3, D4, D5, D6, D7 and D8 may be sequentially-incremented values. For example, the first to eighth dose values D1, D2, D3, D4, D5, D6, D7 and D8 may sequentially be 26.8 mJ/cm$^2$, 27.8 mJ/cm$^2$, 28.8 mJ/cm$^2$, 29.8 mJ/cm$^2$, 30.8 mJ/cm$^2$, 31.8 mJ/cm$^2$, 32.8 mJ/cm$^2$, and 33.8 mJ/cm$^2$.

In an example embodiment, the number of focus values of the wafer for split SW may be a number other than 7. For example, the number of focus values may be 6 or less, or may be 8 or more. In an example embodiment, the number of dose values of the wafer for split SW may be a number other than 8. For example, the number of dose values may be 7 or less, or may be 9 or more. For convenience of description, the following description will be given in conjunction with an example in which, in the wafer W for split, the number of focus values is 7, and the number of dose values is 8.

Referring to FIGS. 2, 3, 4A and 4B, split patterns SP may be formed in each of the shot regions SR of the wafer for split SW (S120). An exposure process may be performed for each shot region SR using a focus value and a dose value corresponding to the shot region SR, and a development process may be performed. For example, for the first shot region SR1, an exposure process may be performed using the seventh focus value F7 and the third dose value D3, and, for the sixth shot region SR6, an exposure process may be performed using the sixth focus value F6 and the third dose value D3. For respective shot regions SR, split patterns SP may be formed under conditions of different focus values and different dose values.

In respective shot regions SR, split patterns SP may be formed such that numbers of split patterns SP are equal. For example, the number of split patterns SP formed in the first shot region SR1 (see, e.g., FIG. 4A) may be equal to the number of split patterns SP formed in the sixth shot region SR6 (see, e.g., FIG. 4B).

In respective shot regions SR, split patterns SP may be formed such that relative positions of split patterns SP are identical. For example, relative positions of split patterns SP formed in the first shot region SR1 with respect to the first shot region SR1 may be identical to relative positions of split patterns SP formed in the sixth shot region SR6 with respect to the sixth shot region SR6.

Some of splint patterns SP in each shot region SR may be selected (S130). The selected split patterns SP may be defined as selection patterns. In each shot region SR, first to m-th selection patterns SEP1, SEP2, SEP3, . . . , and SEPm may be selected. For example, in the first shot region SR1, first to m-th selection patterns SEP1, SEP2, SEP3, . . . , and SEPm may be selected and, in the sixth shot region SR6, first to m-th selection patterns SEP1, SEP2, SEP3, . . . , and SEPm may be selected.

Each of the first to m-th selection patterns SEP1, SEP2, SEP3, . . . , and SEPm in each of the shot regions SR may be disposed at the same relative position as corresponding ones of the remaining shot regions SR. For example, the relative position of the first selection pattern SEP1 in the first shot region SR1 with respect to the first shot region SR1 may be identical to the relative position of the first selection pattern SEP1 in the sixth shot region SR6 with respect to the sixth shot region SR6.

In an example embodiment, split patterns SP having a relatively high process failure possibility from among all split patterns SP may be selected as the selection patterns SEP1, SEP2, SEP3, . . . , and SEPm. For example, the split pattern SP having a smaller inter-pattern distance than the remaining split patterns SP may be selected. In another example, the split pattern SP having a smallest pitch size from among the split patterns SP may be selected.

For each shot region SR, a CD value of each of the selection patterns SEP1, SEP2, SEP3, . . . , and SEPm thereof may be measured (S140). For example, a CD value of the first selection pattern SEP1 of the first shot region SR1 may be measured, and a CD value of the first selection pattern SEP1 of the sixth shot region SR6 may be measured. The measured CD value may be defined as a measurement CD value. As CD values of the first to m-th selection patterns SEP1, SEP2, SEP3, . . . , and SEPm are completely measured, measurement CD values as in the following TABLE 1 may be obtained.

TABLE 1

|  | SR1 | SR2 | SR3 | . . . | SRn |
|---|---|---|---|---|---|
| SEP1 | MCD11 | MCD21 | MCD31 | . . . | MCDn1 |
| SEP2 | MCD12 | MCD22 | MCD32 | . . . | MCDn2 |
| SEP3 | MCD13 | MCD23 | MCD33 | . . . | MCDn3 |
| . . . | . . . | . . . | . . . | . . . | . . . |
| SEPm | MCD1m | MCD2m | MCD3m | . . . | MCDnm |

As shown in TABLE 1, measurement CD values of the first to m-th selection patterns SEP1, SEP2, SEP3, . . . , and SEPm for each of the first to n-th shot regions SR1, SR2, SR3, . . . , and SRn may be measured. The measurement CD values for the first selection patterns SEP1 may be defined as first measurement CD values MCD11, MCD21, MCD31, . . . , and MCDn1. The measurement CD values for the second selection patterns SEP2 may be defined as second measurement CD values MCD12, MCD22, MCD32, . . . , and MCDn2. The measurement CD values for the third selection patterns SEP2 may be defined as third measurement CD values MCD13, MCD23, MCD33, . . . , and MCDn3. The measurement CD values for the m-th second selection patterns SEPm may be defined as m-th measurement CD values MCD1m, MCD2m, MCD3m, . . . , and MCDnm.

Figure 5A:
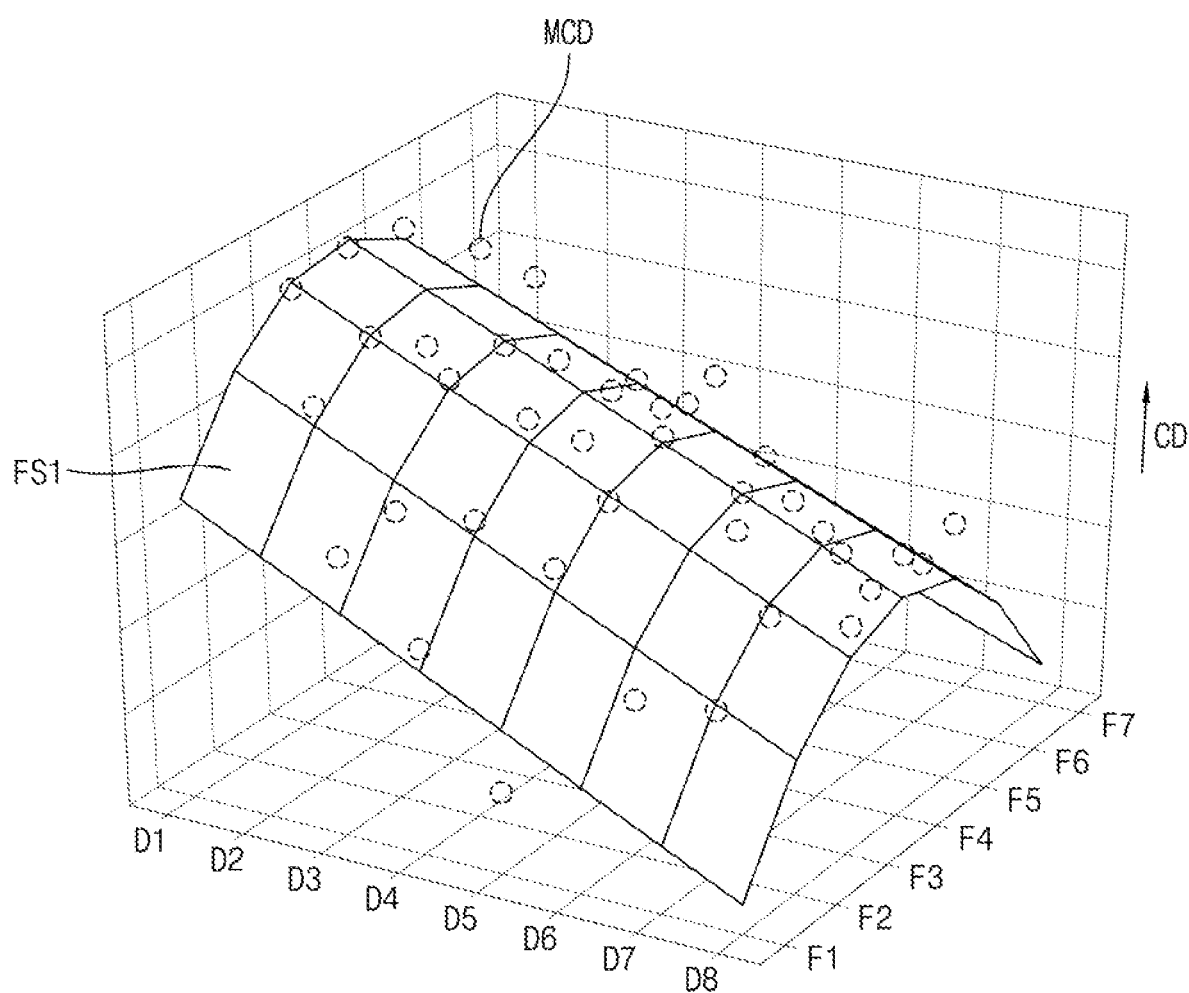
FIGS. 5A and 5B are diagrams explaining a curved fitting surface plotted using measurement CD values.
Figure 5B:
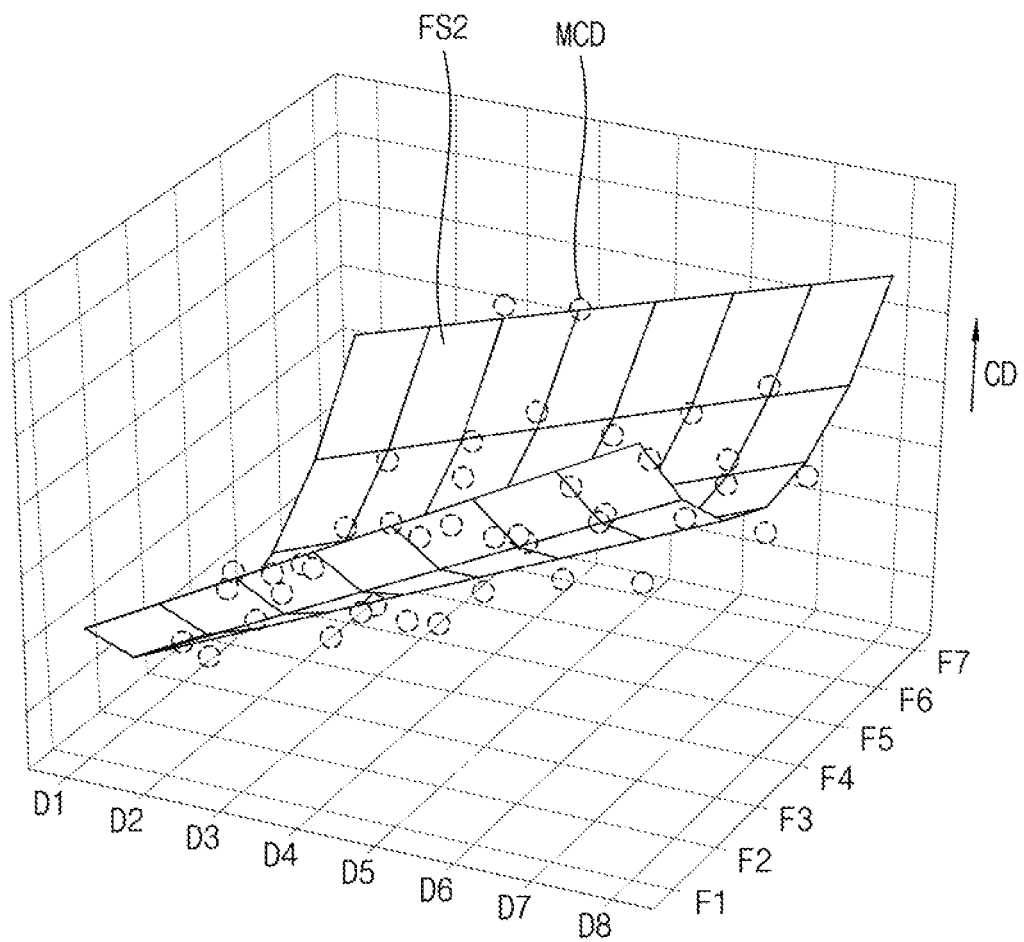

FIGS. 5A and 5B are diagrams explaining a curved fitting surface plotted using measurement CD values.

Referring to FIGS. 1, 5A and 5B, effective CD functions based on a focus value (F) and a dose value (D) for the selection patterns SEP1, SEP2, SEP3, . . . , and SEPm may be derived using measurement CD values of the selection patterns SEP1, SEP2, SEP3, . . . , and SEPm, respectively (S200). For example, a first effective CD function ECD1(F, D) for the first selection patterns SEP1 may be derived using the first measurement CD values MCD11, MCD21, MCD31, . . . , and MCDn1 of the first selection patterns SEP1, and a second effective CD function ECD2(F,D) for the second selection patterns SEP2 may be derived using the second measurement CD values MCD12, MCD22, MCD32, . . . , and MCDn2 of the second selection patterns SEP2. The effective DC functions may be functions for the focus value F and the dose value D. Thus, the effective CD functions may depend on a focus value F and a dose value D. The focus value F may be, for example, a continuous variable having a range between the first focus value F1 and the seventh focus value F7, and the dose value D may be, for example, a continuous variable having a range between the first dose value D1 and the eighth dose value D8.

The effective CD functions may be derived through a data fitting procedure. For example, the first effective CD function ECD1(F,D) may be derived through a data fitting procedure for the first measurement CD values MCD11, MCD21, MCD31, . . . , and MCDn1.

In an example embodiment, a curved fitting surface for each of the selection patterns SEP1, SEP2, SEP3, . . . , and SEPm may be plotted through a data fitting procedure for measurement CD values. The curved fitting surface may represent an effective CD value according to a focus value and a dose value. For example, a first curved fitting surface FS1 may be plotted using measurement CD values MCD, as shown in FIG. 5A, and a second curved fitting surface FS2 may be plotted using measurement CD values MCD, as shown in FIG. 5B. The curved fitting surface for each of the selection patterns SEP1, SEP2, SEP3, . . . , and SEPm may correspond to an effective CD function for the selection pattern. For example, the curved fitting surface for the first selective patterns SEP1 may correspond to the first effective CD function ECD1(F,D).

The effective CD value of each of the selection patterns SEP1, SEP2, SEP3, . . . , and SEPm for each of the shot regions SR1, SR2, SR3, . . . , and SRn may be calculated (S300). The effective CD value may be calculated by substituting the focus value and the dose value of each of the shot regions SR1, SR2, SR3, . . . , and SRn into the effective CD function of each of the selection patterns SEP1, SEP2, SEP3, . . . , and SEPm that is derived above. For example, an effective CD value ECD11 of the first selection pattern SEP1 of the first shot region SR1 may be calculated by substituting the seventh focus value F7 and the third dose value D3 into the first effective CD function ECD1(F,D) of the first selection pattern SEP1 of the first shot region SR1. The effective CD value of each of the selection patterns SEP1, SEP2, SEP3, . . . , and SEPm for each shot region SR may be calculated, as shown in the following TABLE 2.

TABLE 2

| | SR1 | SR2 | SR3 | . . . | SRn |
|---|---|---|---|---|---|
| SEP1 | ECD11 | ECD21 | ECD31 | . . . | ECDn1 |
| SEP2 | ECD12 | ECD22 | ECD32 | . . . | ECDn2 |
| SEP3 | ECD13 | ECD23 | ECD33 | . . . | ECDn3 |
| . . . | . . . | . . . | . . . | . . . | . . . |
| SEPm | ECD1m | ECD2m | ECD3m | . . . | ECDnm |

For example, the effective CD value of the first selection pattern SEP1 for the first shot region SR1 may be ECD11, and the effective CD value of the second selection pattern SEP2 for the second shot region SR2 may be ECD22.

Upper-limit CD values and lower-limit CD values may be calculated using the effective CD values ECD11, . . . , and ECDnm (S400). Each upper-limit CD value may be greater than the effective CD value corresponding thereto by X %. For example, an upper-limit CD value UL11 of the first selection pattern SEP1 for the first shot region SR1 may be greater than the effective CD value ECD11 of the first selection pattern SEP1 by X % (that is, UL11=ECD11* (100+X)/100). Each lower-limit CD value may be smaller than the effective CD value corresponding thereto by X %. For example, a lower-limit CD value LL11 of the first selection pattern SEP1 for the first shot region SR1 may be smaller than the effective CD value ECD11 of the first selection pattern SEP1 by X % (that is, LL11=ECD11* (100−X)/100). Here, "X" may be determined to be a suitable number or numeral, taking into consideration a process window range, photoresist pattern failure, etc. For example, "X" may be 5.

Respective upper-limit CD values of the selection patterns SEP1, SEP2, SEP3, . . . , and SEPm for the shot regions SR1, SR2, SR3, . . . , and SRn may be calculated, as shown in the following TABLE 3.

TABLE 3

| | SR1 | SR2 | SR3 | . . . | SRn |
|---|---|---|---|---|---|
| SEP1 | UL11 | UL21 | UL31 | . . . | ULn1 |
| SEP2 | UL12 | UL22 | UL32 | . . . | ULn2 |
| SEP3 | UL13 | UL23 | UL33 | . . . | ULn3 |
| . . . | . . . | . . . | . . . | . . . | . . . |
| SEPm | UL1m | UL2m | UL3m | . . . | ULnm |

Respective lower-limit CD values of the selection patterns SEP1, SEP2, SEP3, . . . , and SEPm for the shot regions SR1, SR2, SR3, . . . , and SRn may be calculated, as shown in the following TABLE 4.

TABLE 4

| | SR1 | SR2 | SR3 | . . . | SRn |
|---|---|---|---|---|---|
| SEP1 | LL11 | LL21 | LL31 | . . . | LLn1 |
| SEP2 | LL12 | LL22 | LL32 | . . . | LLn2 |
| SEP3 | LL13 | LL23 | LL33 | . . . | LLn3 |
| . . . | . . . | . . . | . . . | . . . | . . . |
| SEPm | LL1m | LL2m | LL3m | . . . | LLnm |

Figure 6A:
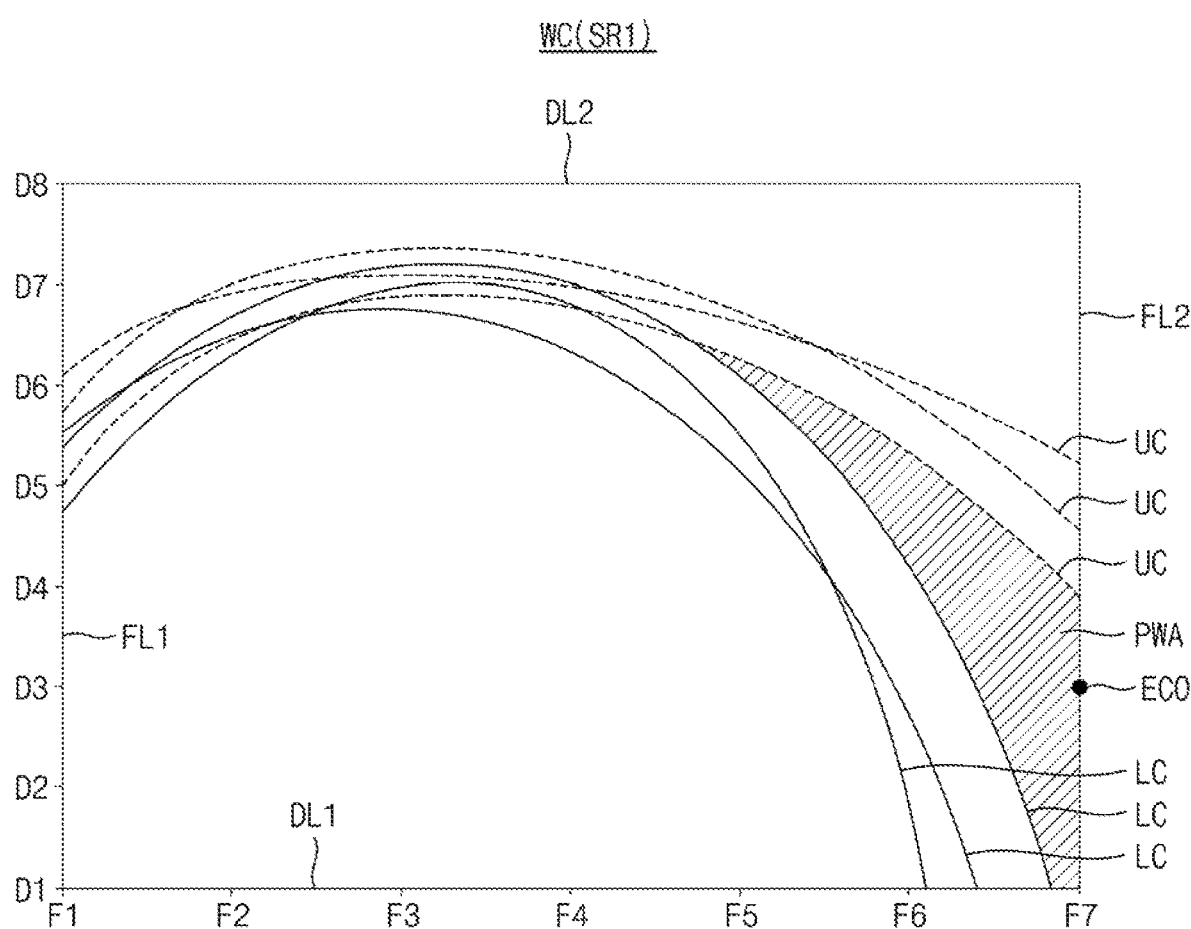
FIGS. 6A and 6B are diagrams explaining a window calculation diagram.
Figure 6B:
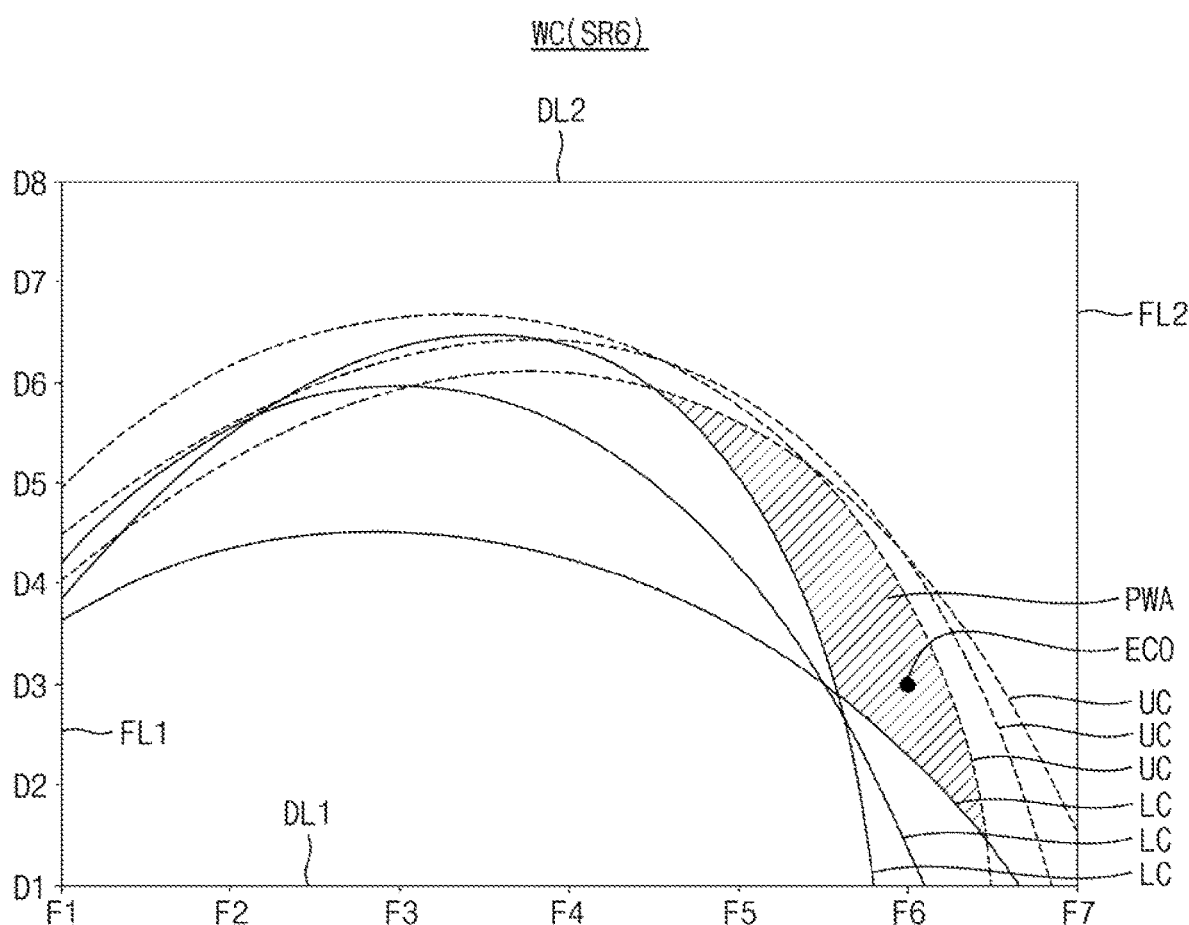

FIGS. 6A and 6B are diagrams explaining a window calculation diagram.

Referring to FIGS. 6A and 6B, a window calculation diagram WC for each shot region SR may be plotted using upper-limit CD values, effective CD functions, an effective CD function and a curved fitting surface (S500). For example, FIG. 6A may be a window calculation diagram WC for the first shot region SRL and FIG. 6B may be a window calculation diagram WC for the sixth shot region SR6.

The window calculation diagram WC may include upper-limit curves UC and lower-limit curves LC. The upper-limit curves UC and the lower-limit curves LC may be Bossung curves. For each shot region SR, each upper-limit curve UC thereof may represent a focus value and a dose value causing a corresponding one of the selective patterns SEP1, SEP2, SEP3, . . . , and SEPm to have an upper-limit CD value. For each shot region SR, each lower-limit curve UC thereof may represent a focus value and a dose value causing a corresponding one of the selective patterns SEP1, SEP2, SEP3, . . . , and SEPm to have a lower-limit CD value.

For example, referring to FIG. 6A, in the window calculation diagram WC for the first shot region SR1, each upper-limit curve UC may represent a focus value and a dose value causing a corresponding one of the selective patterns SEP1, SEP2, SEP3, . . . , and SEPm to have a corresponding one of the upper-limit CD values UL11, UL12, UL13, . . . , and UL1m, and each lower-limit curve LC may represent a focus value and a dose value causing a corresponding one of the selective patterns SEP1, SEP2, SEP3, . . . , and SEPm to have a corresponding one of the lower-limit CD values LL11, LL12, LL13, . . . , and LL1m. In more detail, for example, the upper-limit curve UC for the first selection pattern SEP1 of the first shot region SR1 may represent a focus value and a dose value causing the first selection pattern SEP1 of the first shot region SR1 to have the upper-limit CD value UL11.

Although only three upper-limit curves UC and three lower-limit curves LC are shown in FIG. 6A for convenience of description, upper-limit curves UC and lower-limit curves LC may be plotted such that the number of the upper-limit curves UC and the number of the lower-limit curves LC are equal to the number of the selection patterns SEP1, SEP2, SEP3, . . . , and SEPm. In another example, in FIG. 6B, upper-limit curves UC and lower-limit curves LC for the selection patterns of the sixth shot region SR6 may be plotted.

The window calculation diagram WC may further include a first focus limit line FL1, a second focus limit line FL2, a first dose limit line DL1, and a second dose limit line DL2. The first and second focus limit lines FL1 and FL2 may be plotted in accordance with a maximum focus value and a minimum focus value in an exposure process for formation of split patterns SP. The first and second dose limit lines DL1 and DL2 may be plotted in accordance with a maximum dose value and a minimum dose value in an exposure process for formation of split patterns SP.

For example, referring to FIG. 6A, in the window calculation diagram WC for the first shot region SR1, the first focus limit line FL1 may be plotted in accordance with the first focus value F1, the second focus limit line FL2 may be plotted in accordance with the seventh focus value F7, the first dose limit line DL1 may be plotted in accordance with the first dose value D1, and the second dose limit line DL2 may be plotted in accordance with the eighth dose value D8.

A process window area PWA for each shot region SR may be calculated using the window calculation diagram WC for the shot region SR (S600). The process window area PWA may represent a process window according to a focus value and dose value at which the corresponding shot region SR is exposed. In each shot region SR, the process window area PWA may be a region including an exposure condition point ECO corresponding to a focus value and a dose value at which the shot region SR is exposed.

For example, referring to FIG. 6A, the process window area PWA in the first shot region SR1 may include an exposure condition point ECO corresponding to the seventh focus value F7 and the third dose value D3 at which the first shot region SR1 is exposed. In another example, referring to FIG. 6B, the process window area PWA in the sixth shot region SR6 may include an exposure condition point ECO corresponding to the sixth focus value F6 and the third dose value D3 at which the sixth shot region SR6 is exposed.

The process window area PWA may be defined by at least a part of upper-limit curves UC, lower-limit curves LC, first and second focus limit lines FL1 and FL2, and first and second dose limit lines DL1 and DL2. The process window area PWA may be a region surrounded by at least a part of the upper-limit curves UC, the lower-limit curves LC, the first and second focus limit lines FL1 and FL2, and the first and second dose limit lines DL1 and DL2.

For example, referring to FIG. 6A, the process window area PWA of the first shot region SR1 may be a region defined by an upper-limit curve UC, a lower-limit curve LC, a first focus limit line FL1, and a second focus limit line FL2. In another example, referring to FIG. 6B, the process window area PWA of the sixth shot region SR6 may be a region defined by two upper-limit curves UC and two lower-limit curves LC.

For all shot regions SR, process window areas PWA may be derived, respectively. Since the shot regions SR are exposed at different focus values and different dose values, respectively, process window areas PWA may be derived for the different focus values and the different dose values, respectively. For example, the process window area PWA of FIG. 6A may be defined as a process window area PWA for the seventh focus value F7 and the third dose value D3, and the process window area PWA of FIG. 6B may be defined as a process window area PWA for the sixth focus value F6 and the third dose value D3.

Subsequently, process window area ratios may be calculated for all shot regions SR, respectively, as shown in the following TABLE 5.

TABLE 5

| SR1 | SR2 | SR3 | . . . | SRn |
|---|---|---|---|---|
| PWAr1 | PWAr2 | PWAr3 | . . . | PWArn |

Figure 7:
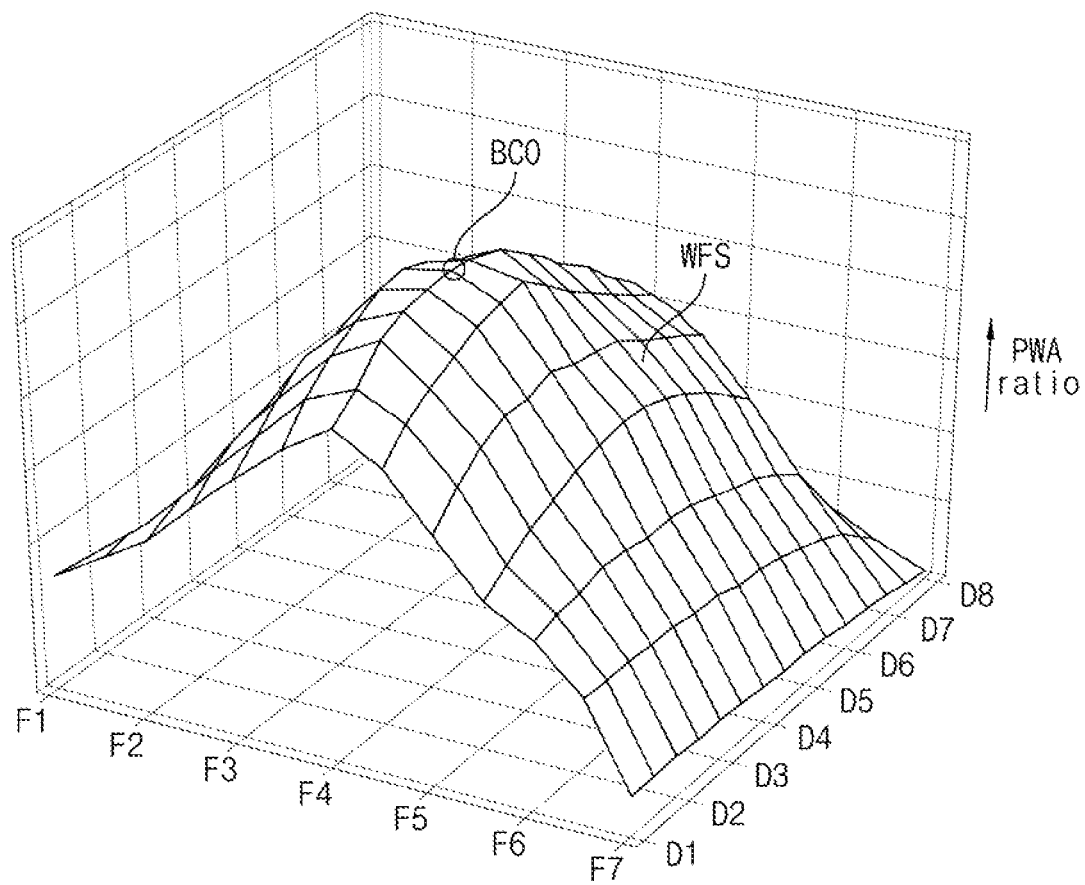
FIG. 7 is a view explaining a curved window fitting surface.

FIG. 7 is a view explaining a curved window fitting surface.

Referring to FIG. 7, a curved window fitting surface WFS may be plotted through a data fitting procedure for process window area ratios PWAr1, PWAr2, PWAr3, . . . , and PWArn respectively calculated as described above for the shot regions SR1, SR2, SR3, . . . , and SRn. The curved window fitting surface WFS may represent respective ratios of process window areas for the shot regions SR1, SR2, SR3, . . . , and SRn. The curved window fitting surface WFS may represent process window area ratios (PWA ratios) for focus values and dose values at which the shot regions SR1, SR2, SR3, . . . , and SRn are exposed, respectively. In an example embodiment, a function of a process window area ratio for a focus value and a dose value may be derived together with the curved window fitting surface WFS.

A best condition point BCO, at which a maximum process window area ratio (PWA ratio) is obtained, may be derived using the curved window fitting surface WFS, and a focus value and a dose value, at which the maximum process window area ratio (PWA ratio) is obtained, may be derived.

In another implementation, the focus value and the dose value, at which the maximum process window area ratio (PWA ratio) is obtained, may be derived using the process window area ratio function.

The focus value and the dose value, at which the maximum process window area ratio (PWA ratio) is obtained, may be determined to be a best focus value and a best dose value in an exposure process, respectively (S700). Thus, the focus value and the dose value, at which the process window area is maximized, may be determined to be a best focus value and a best dose value in an exposure process, respectively.

The best focus value and the best dose value, at which the process window area is maximized, may be determined through comparison of the process window areas for all shot regions SR1, SR2, SR3, . . . , and SRn described above. In an extreme ultraviolet (EUV) exposure process, a best focus value and a best dose value may be determined through the above-described method.

In accordance with the value of X for calculation of upper-limit CD values and lower-limit CD values, the upper-limit curves UC and the lower-limit curves LC of the window calculation diagram WC may be varied, and the process window area PWA may be varied, and, as such, a best focus value and a best dose value, which are derived, may be varied.

The method according to the example embodiments of the disclosure may derive a stable effective CD function and a stable fitting surface using measurement CD values of selection patterns selected from among split patterns by sufficiently increasing the number of the selection patterns (for example, m>50). Accordingly, effective CD values of the selection patterns may be calculated and, as such, a best focus value and a best dose value, at which a maximum process window area is obtained, may be determined without using a target CD value.

The method according to the above example embodiment may determine the value of X in accordance with a CD tolerance, and may determine a best focus value and a best dose value according to the CD tolerance.

Figure 8:
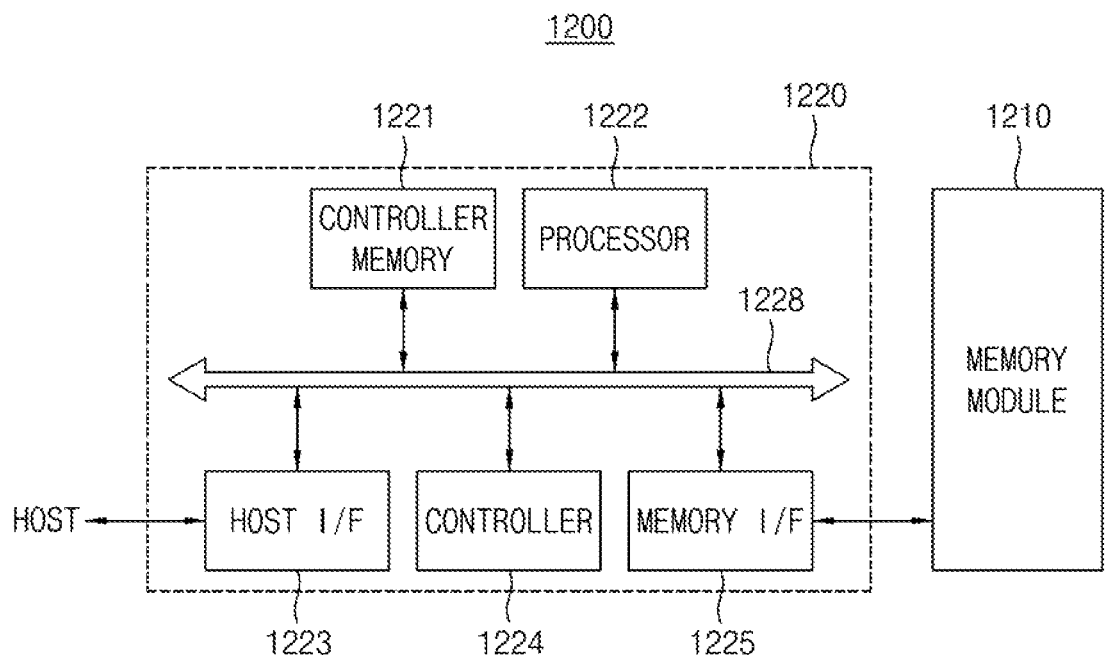
FIG. 8 is a block diagram of a memory card including an integrated circuit device manufactured through an exposure process according to an example embodiment.

FIG. 8 is a block diagram of a memory card including an integrated circuit device manufactured through an exposure process according to an example embodiment.

Referring to FIG. 8, a memory card 1200 may include a memory controller 1220 to generate command and address signals C/A, and a memory module 1210, for example, a flash memory including one flash memory device or a plurality of flash memory devices.

The memory controller 1220 may include a host interface 1223 to transmit command and address signals to a host or to receive these signals from the host, and a memory interface 1225 to again transmit the command and address signals to the memory module 1210 or to receive these signals from the memory module 1210. The host interface 1223, a controller 1224, and the memory interface 1225 may communicate with a controller memory 1221, such as SRAM, and a processor 1222, such as a central processing unit (CPU), via a common bus 1228.

The memory module 1210 receives command and address signals from the memory controller 1220. In response to the received command and address signals, the memory module 1210 may store data in at least one of memory devices thereon, and may retrieve data from at least one of the memory devices. Each memory device may include a plurality of addressable memory cells, and a decoder to receive command and address signals and to generate a row signal and a column signal in order to access at least one of the addressable memory cells during programming and read-out operations.

At least one of constituent elements of the memory card 1200 including the memory controller 1220, the electronic devices 1221, 1222, 1223, 1224, and 1225 included in the memory controller 1220, and the memory module 1210 may include an integrated circuit device manufactured through an exposure process according to an example embodiment.

Figure 9:
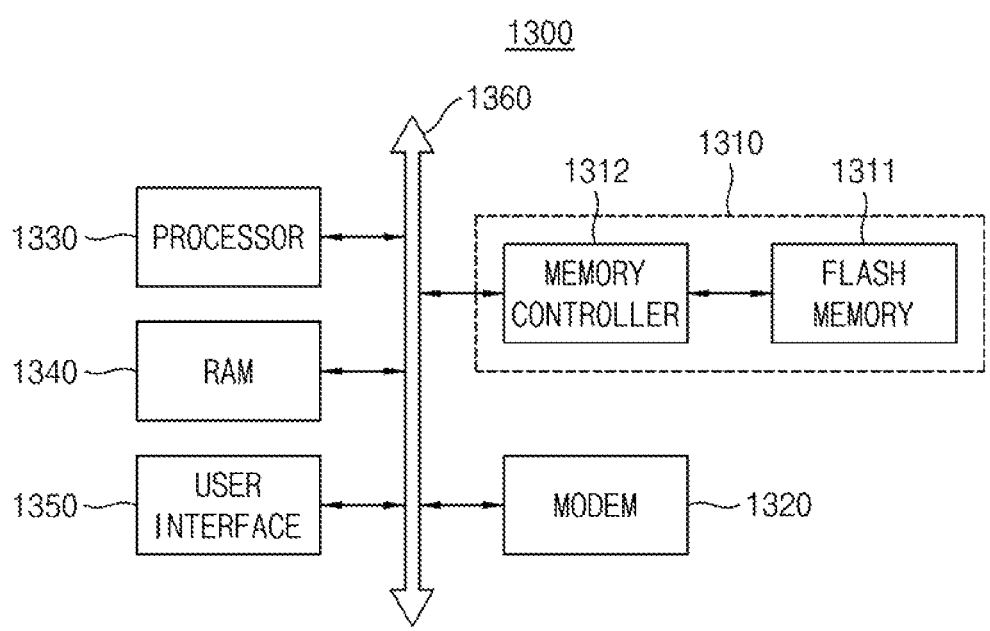
FIG. 9 is a block diagram of a memory system using a memory card including an integrated circuit device manufactured through an exposure process according to an example embodiment.

FIG. 9 is a block diagram of a memory system using a memory card including an integrated circuit device manufactured through an exposure process according to an example embodiment.

A memory system 1300 may include a processor 1330 (such as a CPU), a random access memory 1340, a user interface 1350, and a modem 1320, which perform communication via a common bus 1360. Each of these devices may transmit a signal to a memory card 1310 via the common bus 1360, and may receive a signal from the memory card 1310 via the common bus 1360. At least one of constituent elements of the memory system 1300 including the processor 1330, the random access memory 1340, the user interface 1350 and the modem 1320 together with the memory card 1310 may include an integrated circuit device manufactured through an exposure process according to an example embodiment.

The memory system 1300 may be applied to various electronic application fields. For example, the memory system 1300 may be applied to solid state drive (SSD), CMOS image sensor (CIS) and computer-applicable chip set fields.

Memory systems and devices according to an example embodiment may be packaged in any of various device package forms including, for example, a ball grid array (BGA), a chip-scale package (CSP), a plastic leaded chip carrier (PLCC), a plastic dual in-line package (PDIP), a multi-chip package (MCP), a wafer-level fabricated package (WFP), a wafer-level processed stock package (WSP), etc.

The method according to the example embodiments of the disclosure may calculate effective CD values of selection patterns using measurement CD values of the selection patterns, without using a target CD value, by sufficiently increasing the number of the selection patterns, and may determine a best focus value and a best dose value, at which a maximum process window area is obtained, using the effective CD values of the selection patterns.

By way of summation and review, achieving an enhancement in CD uniformity of a photoresist pattern having a fine CD may be enabled by accurately and reliably setting a lithography process in order.

As described above, embodiments relate to a method for determining a best focus and a best dose in an exposure process without using a target critical dimension (CD) value. Embodiments may provide a method for determining a best focus and a best dose in an exposure process without using a target critical dimension (CD) value.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method, comprising:
selecting a selection pattern from first and second shot regions of a wafer for split;
measuring a critical dimension (CD) value of the selection pattern, thereby deriving a measurement CD value;
calculating an effective CD value of the selection pattern for each of the first and second shot regions using the measurement CD value;
calculating an upper-limit CD value and a lower-limit CD value of the selection pattern using the effective CD value of the selection pattern;
calculating a process window area for the first shot region and a process window area for the second shot region using the upper-limit CD value and the lower-limit CD value of the selection pattern; and
comparing the process window area for the first shot region and the process window area for the second shot region with each other.

2. The method as claimed in claim 1, wherein the selecting of the selection pattern includes selecting first selection patterns and second selection patterns from the first and second shot regions.

3. The method as claimed in claim 2, wherein the deriving of the measurement CD value includes:
measuring CD values of the first selection patterns, thereby deriving first measurement CD values; and
measuring CD values of the second selection patterns, thereby deriving second measurement CD values.

4. The method as claimed in claim 1, wherein the calculating of the effective CD value includes:
deriving an effective CD function through a data fitting procedure for the measurement CD value.

5. The method as claimed in claim 1, wherein the calculating of the process window area for the first shot region and the process window area for the second shot region includes:
plotting a window calculation diagram for each of the first and second shot regions.

6. The method as claimed in claim 5, wherein the window calculation diagram includes an upper-limit curve and a lower-limit curve.

7. The method as claimed in claim 6, wherein:
the upper-limit curve is plotted on the basis of the upper-limit CD value; and
the lower-limit curve is plotted on the basis of the lower-limit CD value.

8. The method as claimed in claim 6, wherein the process window area for the first shot region and the process window area for the second shot region are defined by the upper-limit curve and the lower-limit curve.

9. The method as claimed in claim 1, further comprising:
determining a best focus and a best dose of an extreme ultraviolet exposure process; and
fabricating an integrated circuit device using at least one lithography operation that includes the extreme ultraviolet exposure process, the extreme ultraviolet exposure process using the determined best focus and the determined best dose.

10. A method, comprising:
selecting a first selection pattern and a second selection pattern of a first shot region of a wafer for split, and selecting a first selection pattern and a second selection pattern of a second shot region of the wafer for split;
calculating upper-limit CD values and lower-limit CD values of the first selection pattern of the first shot region, the second selection pattern of the first shot region, the first selection pattern of the second shot region and the second selection pattern of the second shot region;
calculating a process window area for the first shot region and a process window area for the second shot region using the upper-limit CD values and the lower-limit CD values; and
comparing the process window area for the first shot region and the process window area for the second shot region with each other.

11. The method as claimed in claim 10, further comprising:
measuring the first selection pattern of the first shot region and the first selection pattern of the second shot region, thereby deriving first measurement CD values.

12. The method as claimed in claim 11, further comprising:
deriving a first effective CD function using the first measurement CD values.

13. The method as claimed in claim 12, further comprising:
calculating an effective CD value of the first selection pattern of the first shot region and an effective CD value of the first selection pattern of the second shot region using the first effective CD function.

14. The method as claimed in claim 11, further comprising:
plotting a first curved fitting surface using the first measurement CD values.

15. The method as claimed in claim 10, wherein the calculating of the process window area for the first shot region includes:
plotting a window calculation diagram for the first shot region.

16. The method as claimed in claim 15, further comprising:
exposing the first shot region at a first focus value and a first dose value,
wherein the process window area for the first shot region is a region including an exposure condition point corresponding to the first focus value and the first dose value in the window calculation diagram for the first shot region.

17. A method, comprising:
exposing a first shot region of a wafer for split at a first focus value and a first dose value, and exposing a second shot region of the wafer for split at a second focus value and a second dose value;
selecting a first selection pattern and a second selection pattern of the first shot region, and selecting a first selection pattern and a second selection pattern of the second shot region;
measuring CD values of the first selection pattern of the first shot region and the first selection pattern of the second shot region, thereby deriving first measurement CD values, and measuring CD values of the second selection pattern of the first shot region and the second selection pattern of the second shot region, thereby deriving second measurement CD values;
deriving a first effective CD function using the first measurement CD values, and deriving a second effective CD function using the second measurement CD values; and calculating effective CD values of the first and second shot regions using the first effective CD function and the second effective CD function.

18. The method as claimed in claim 17, wherein the calculating of the effective CD values of the first and second shot regions includes:

substituting the first focus value and the first dose value into the first effective CD function, thereby calculating an effective CD value of the first selection pattern of the first shot region; and substituting the second focus value and the second dose value into the second effective CD function, thereby calculating an effective CD value of the second selection pattern of the second shot region.

19. The method as claimed in claim 17, further comprising:

calculating a process window area for each of the first shot region and the second shot region.

20. The method as claimed in claim 19, further comprising:

determining a focus value and a dose value at which each process window area is maximized.

\* \* \* \* \*